US007012846B2

(12) United States Patent
Balasubramanian et al.

(10) Patent No.: US 7,012,846 B2
(45) Date of Patent: Mar. 14, 2006

(54) SENSE AMPLIFIER FOR A MEMORY ARRAY

(75) Inventors: Suresh Balasubramanian, Coimbatore TamilNadu (IN); Stephen Wayne Spriggs, Rowlett, TX (US); Bryan D. Sheffield, Rowlett, TX (US); Mohan Mishra, Madhubani (IN)

(73) Assignee: Texas Instruments Incorporated, Dallas, TX (US)

(*) Notice: Subject to any disclaimer, the term of this patent is extended or adjusted under 35 U.S.C. 154(b) by 116 days.

(21) Appl. No.: 10/768,098

(22) Filed: Feb. 2, 2004

(65) Prior Publication Data

US 2005/0169077 A1 Aug. 4, 2005

(51) Int. Cl.
*G11C 7/00* (2006.01)

(52) U.S. Cl. ...................... 365/205; 365/208; 365/242; 365/243; 365/189.05

(58) Field of Classification Search ................ 365/205, 365/208, 242, 243, 189.05
See application file for complete search history.

(56) References Cited

U.S. PATENT DOCUMENTS

| | | | | |
|---|---|---|---|---|
| 5,737,273 | A * | 4/1998 | Fujiwara et al. | 365/205 |
| 6,597,613 | B1 * | 7/2003 | Becker et al. | 365/207 |
| 6,734,719 | B1 * | 5/2004 | Tanzawa et al. | 327/541 |
| 6,856,547 | B1 * | 2/2005 | Poidomani et al. | 365/185.21 |

* cited by examiner

*Primary Examiner*—Connie C. Yoha
(74) *Attorney, Agent, or Firm*—Alan K. Stewart; W. James Brady, III; Frederick J. Telecky, Jr.

(57) ABSTRACT

A sense amplifier which senses whether current is present on a bit line, and generates one logical value if current is present and another logical value if current is not present. As the sense amplifier can be implemented to generate such logical values with a current signal of low strength, memory arrays with correspondingly low drive strength can be implemented. As a result, memory systems which consume minimal power and having high density can be provided. In addition, as the sense amplifiers can operate without any reference signals, the implementation of sense amplifiers may be simplified.

10 Claims, 8 Drawing Sheets

SENSE AMPLIFIER FOR A MEMORY ARRAY

RELATED APPLICATION

The present application is related to co-pending application entitled, "Tracking Circuit Enabling Quick/Accurate Retrieval of Data Stored in a Memory Array", Ser. No. Unassigned, Filed: on even date herewith, Ser. No. unassigned, Ser. No. 10/768,131, assigned to common assignee, and naming as inventors: Balasuramanian et al.

BACKGROUND OF THE INVENTION

1. Field of the Invention

The present invention relates to the design of memories, and more specifically to a sense amplifier which senses the output received from a bit cell of a memory array as either 0 or 1.

2. Related Art

A memory array generally contains multiple cells, with each cell storing a data bit (typically of binary value). Memory arrays are implemented using technologies such as SRAMs (static random access memories) and DRAM (dynamic RAMs), as is well known in the relevant arts.

A sense amplifier is often provided associated with such memory arrays. A sense amplifier generally determines whether a signal received on a bit line represents a 0 or 1. The signal in turn is propagated/presented on the bit line based on a specific cell selected (usually based on a memory address) in the memory array. Thus, the sense amplifier generally provides an output indicating whether the bit in the selected cell represents a 0 or 1.

In general, the combination of memory arrays and sense amplifier need to be designed meeting several requirements. Examples of such requirements include one or more of minimizing electrical power consumption, minimizing total space consumed, high access rates, decreasing circuit complexity, accurate operation over a wide range of process-temperature-voltage combinations.

In one prior embodiment, an inverter is provided at the end of a bit line, and the selected bit cell needs to be generally designed to apply sufficient voltage strength to the bit line to drive the inverter from one logical value to another logical value if the selected bit cell stores a specific bit value (e.g., 1).

One problem with such an approach is that the memory access rates of corresponding implementations are generally low since the voltage level required to drive the inverter from one logical value to another is generally high. The access rates may be improved by using bit cells of high drive strength, which generally implies that the bit cells need to be implemented to be of large size. Large sized bit cells usually means that the memory arrays would be low density (i.e., consume more space) and/or consume more electric power.

Some of such disadvantages are overcome in an alternative prior embodiment by providing a reference signal, which is compared with the signal strength (e.g., voltage level) on a bit line (driven by a selected bit cell when being accessed). The reference signal is chosen to be of adequately high level such that the actual bit value can be reliably distinguished, and is low enough such that the memory cells can be implemented with a low drive strength.

One problem with such an approach is that generating the reference signal accurately may pose challenges in design/implementation of the corresponding solutions. In addition, the reference signal may need to be high enough causing a correspondingly high amount of electrical power to be consumed.

BRIEF DESCRIPTION OF THE DRAWINGS

The present invention will be described with reference to the following accompanying drawings described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

1. Overview

A sense amplifier provided according to an aspect of the present invention determines whether a current path is present on a bit line which is connected to a bit cell selected while accessing a memory array. In general, a current path is present on a physical path if there is a voltage potential across the path and neither end of the physical path is open.

The sense amplifier generates a first value (e.g., 0) as an output if a current path is present on the bit line and another value as said output otherwise. The output represents the bit value stored in the selected bit cell. Due to such operation, several advantages (e.g., faster read access times, high density memory solutions) may be realized as described below.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Memory System

Figure 1A:
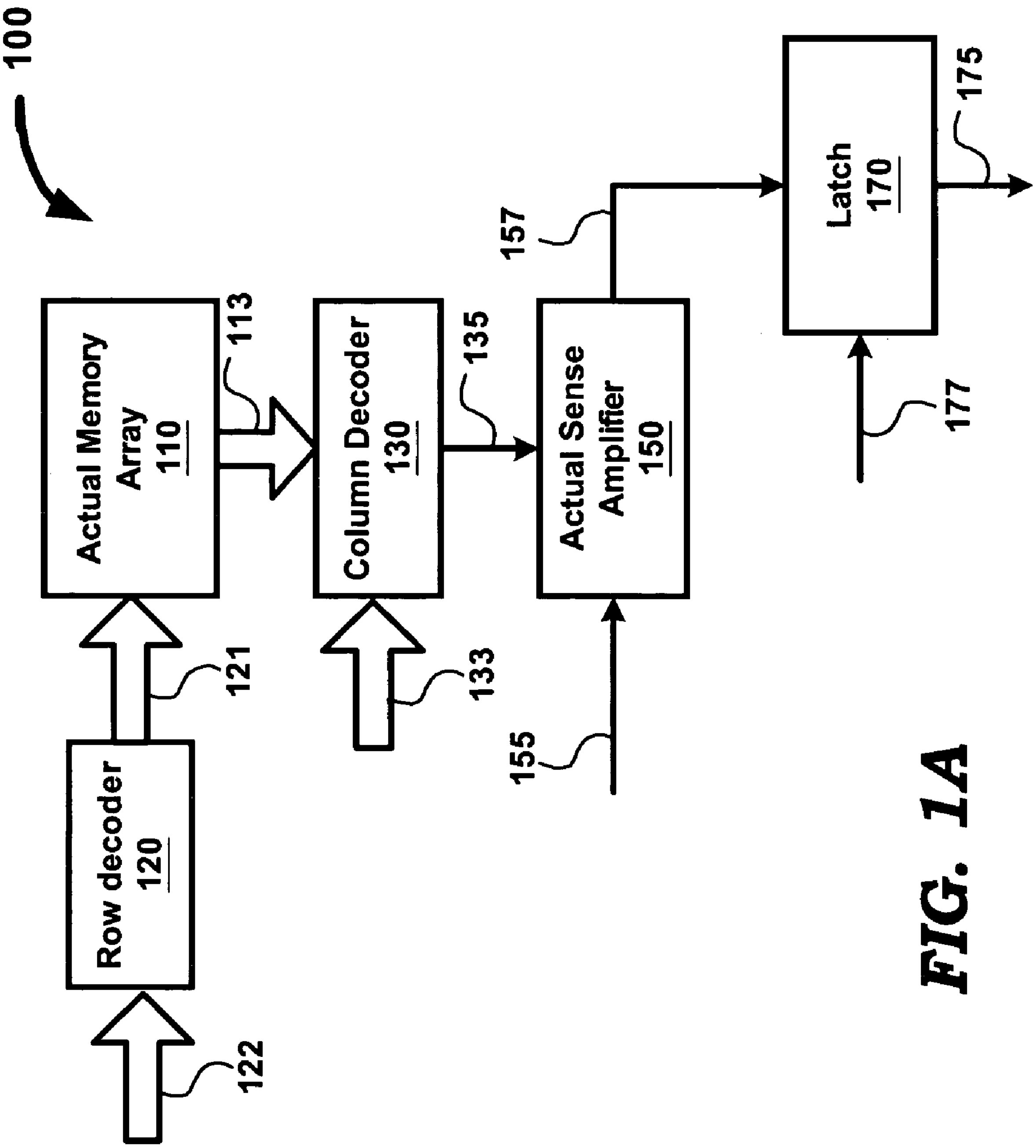
FIG. 1A is a block diagram of an example memory system in which various aspects of the present invention can be implemented.

FIG. 1A is a block diagram of an example memory system in which various aspects of the present invention can be implemented. Memory system 100 is shown containing actual memory array 110, actual sense amplifier 150, and latch 170. The word 'actual' is used associated with components 110 and 150 merely to distinguish from the corresponding 'dummy' elements as described with reference to FIG. 3 below. Each block of FIG. 1 is described briefly below.

Memory array 110 contains multiple cells, with each cell storing a data bit (of binary value). Row decoder 120 determines the specific row of data accessed in memory array 110 according to a row address received on bus 122, and accordingly generates row decode signals 121. The row of bits corresponding to the selected row are provided on bus 113.

Column decoder 130 selects the specific bit of interest (on bit line 135) from the accessed row of bits. The specific bit is determined by a column address received on path 133. The row and column address together form an access address for memory array 110.

Actual sense amplifier 150 (implemented according to various aspects of the present invention) determines whether a current path is present on bit line 135 starting from a time point determined by sense enable 155, and indicates the presence of current path in the form of one bit value and the absence as another bit value. In one embodiment described below, the bit value represents the bit stored in the accessed bit cell.

As the determination of the accessed bit value depends only on sensing the presence/absence of the current path on bit line 135, memory system 100 can be implemented with high access rates. In addition, the bit cells in memory array may not need to be implemented with high drive strength as the bit value may be determined based on a small current variation on bit line 135. Accordingly, each bit cell in the memory array 110 may be implemented using small transistors, thereby enabling implementation of high density memory arrays.

Latch 170 latches the bit value provided on path 157 at a time point specified by latch enable 177. In general, a latch enable signal needs to be generated as soon as the corresponding sense amplifier generates the bit value. However, the specific time at which the bit value would be generated depends on various factors such as the load offered by the memory array while being accessed and PTV conditions. The latch enable signal needs to be generated taking into consideration such variables.

According to an aspect of the present invention, latch enable 177 is generated based on a dummy sense amplifier which is implemented similar to actual sense amplifier 150, and a dummy memory array which is designed to offer an amount of load such that the latch enable signal is generated close to a time point at which the output generated by actual sense amplifier would represent the specific bit accessed from actual memory array 110.

Accordingly, first the operation of an example embodiment of actual memory array 110 is described below in further detail with reference to FIG. 1B. The details of an embodiment of actual sense amplifier 150 are then described. The manner in which latch enable 177 is generated is then described.

3. Actual Memory Array

Figure 1B:
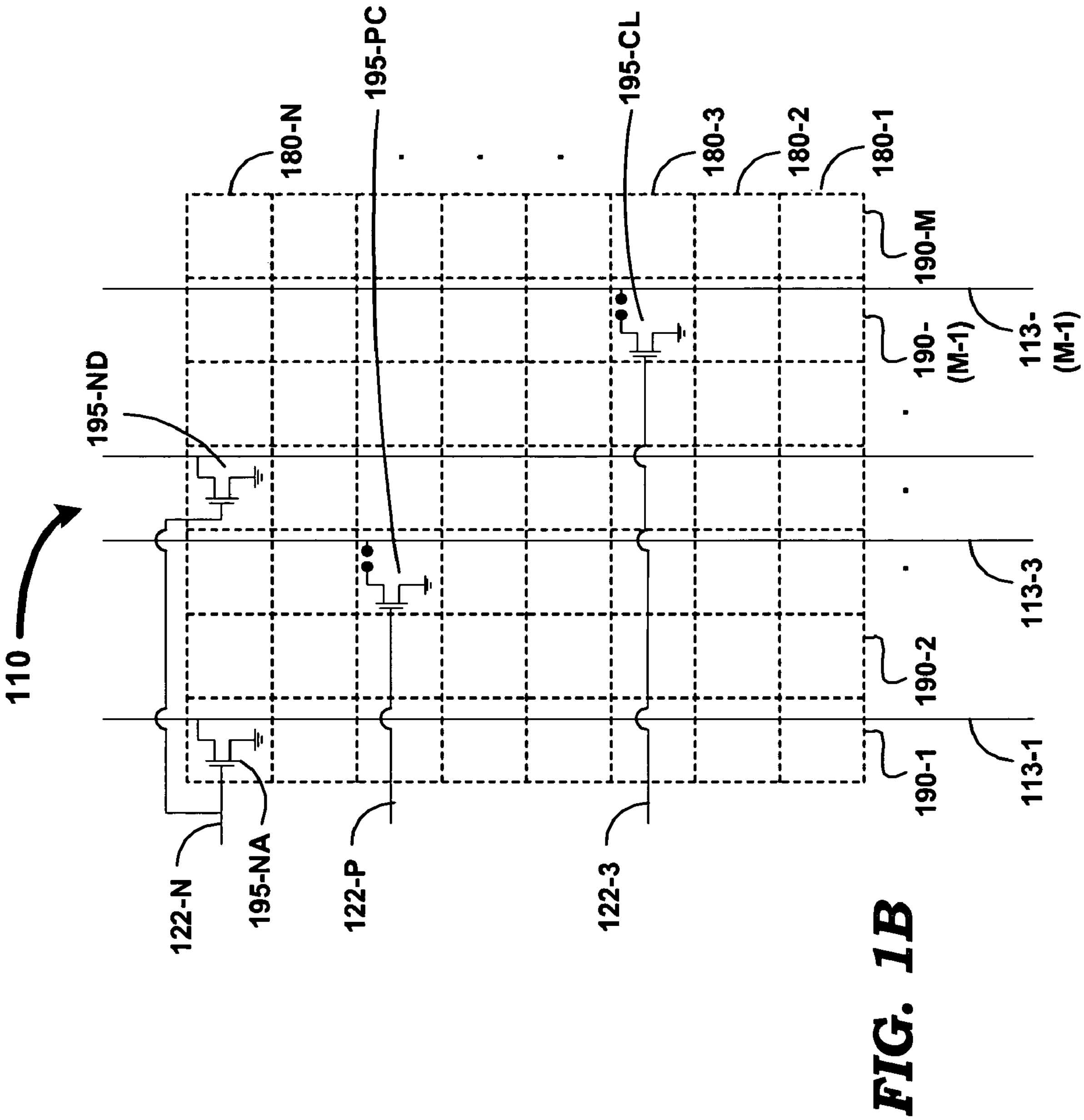
FIG. 1B is a circuit diagram illustrating the details of a memory array in one embodiment.

FIG. 1B is a circuit diagram illustrating the details of actual memory array 110 in one embodiment. For illustration, it is assumed that actual memory array 110 is implemented as N×M array (containing N rows 180-1 through 180-N, and M columns 190-1 through 190-M).

Each bit cell may be programmed to store one bit value by connecting the drain terminal to the corresponding bit line (or column) (e.g., cells 195-NA and 195-ND), and to store the other bit value by leaving the connection open (e.g., cells 195-PC and 195-CL). Merely for conciseness and clarity, the internals (containing NMOS transistor) of only some example cells are shown.

Word lines 122-1 through 122-N are contained within bus 122 (of FIG. 1A), with only one of the word lines being enabled during a read operation. Each word line turns on all the cells in the corresponding enabled row, and signals representing the data stored in all the cells of the corresponding row are provided on corresponding bit lines 113-1 through 113-M. Only one of the bit lines 113-1 through 113-M is selected (on line 135) by column decoder 130, and the signal on the selected line is sensed (and thus read) as a 0 or 1.

It should be appreciated that the signal needs to be first available on bit line 135 before being sensed. In general, there is a positive correlation between the load offered (presented) by the actual memory array 110 during a memory access and the extent of delay in the signal being available on bit line 135 for sensing. Once the signal is available, there is generally a window of duration in which the signal can be sensed. Accordingly, it may be desirable to design the tracking solutions taking into account the worst case load offered while reading a bit from actual memory array 110.

The worst case load offered by actual memory array 110 may be appreciated by first understanding that each bit cell having a drain terminal connected to the corresponding column offers a capacitive load on the column (irrespective of whether the corresponding cell is being accessed). Thus, bit cells 195-NA and 195-ND respectively offer a capacitive load on columns 113-1 and 113-4 respectively, but bit cells 195-PC and 195-CL do not offer significant capacitive load.

Accordingly, during a read access, actual memory array 110 offers maximum possible load when the drain terminals of all the bit cells in a column are connected to the corresponding bit/column line. The description is continued with reference to the details of an example actual sense amplifier.

4. Actual Sense Amplifier

Figure 2A:
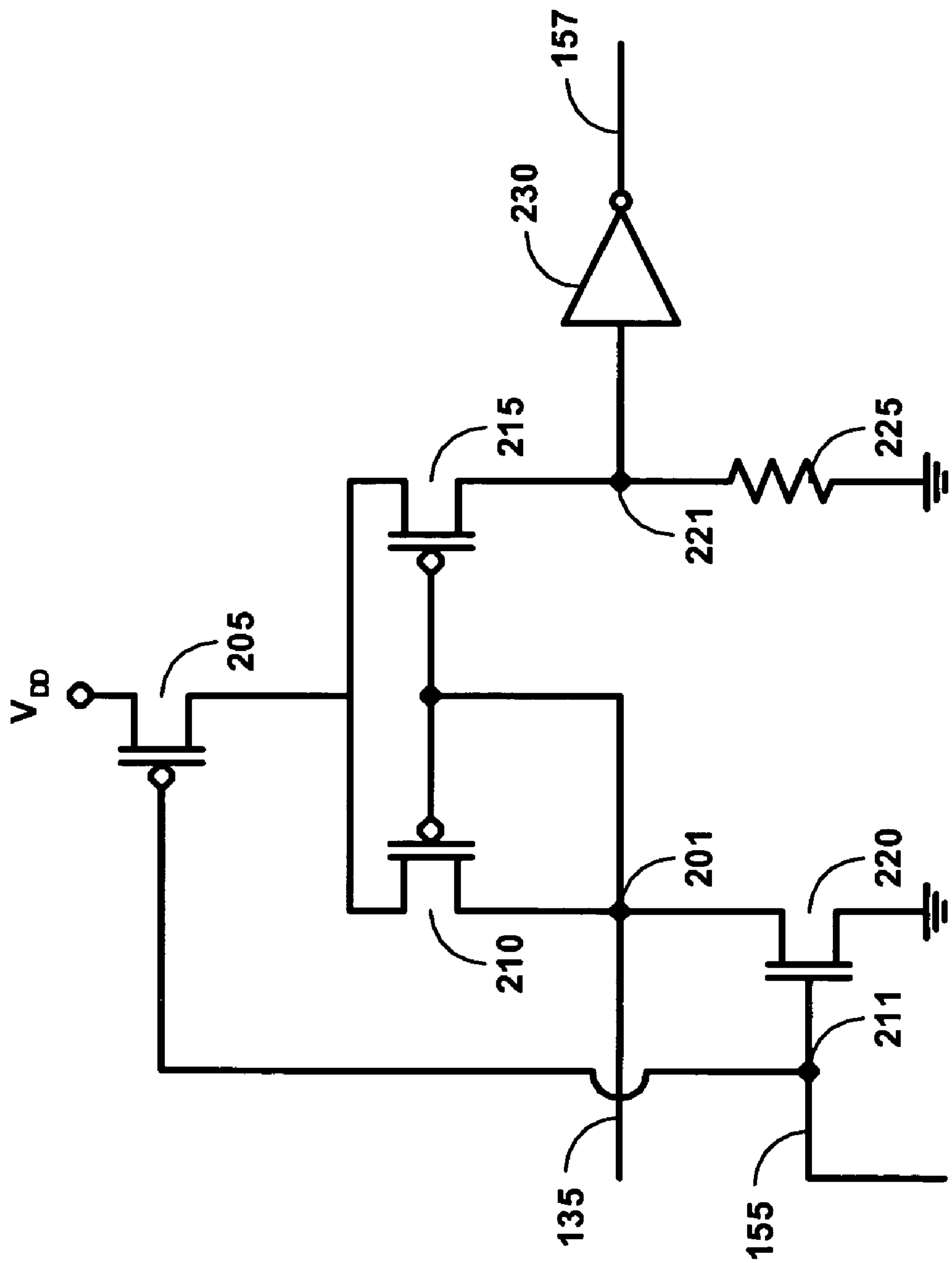
FIG. 2A is a circuit diagram illustrating the details of a sense amplifier in one embodiment.

FIG. 2A is a circuit diagram illustrating the details of actual sense amplifier 150 in an embodiment of the present invention. Sense amplifier 150 is shown containing PMOS transistors 205, 210 and 215, NMOS transistor 220, resistive load 225, and inverter 230. As described below in further detail, actual sense amplifier 150 senses the presence or absence of current on path 135, and generates a bit value on path 157 representing the value of the bit accessed from actual memory array 110.

Bit line 135 is shown connected to the gate terminals of PMOS transistors 210 and 215, the source terminal of PMOS transistor 210, and drain terminal of NMOS transistor 220. Sense enable 155 is shown connected to (node 211) the gate terminal of NMOS transistor 220 and 205. The drain terminal of PMOS transistor 205 is connected to VDD, and the source terminal of PMOS transistor 205 is connected to the drain terminals of both PMOS transistors 210 and 215.

Figure 2B:
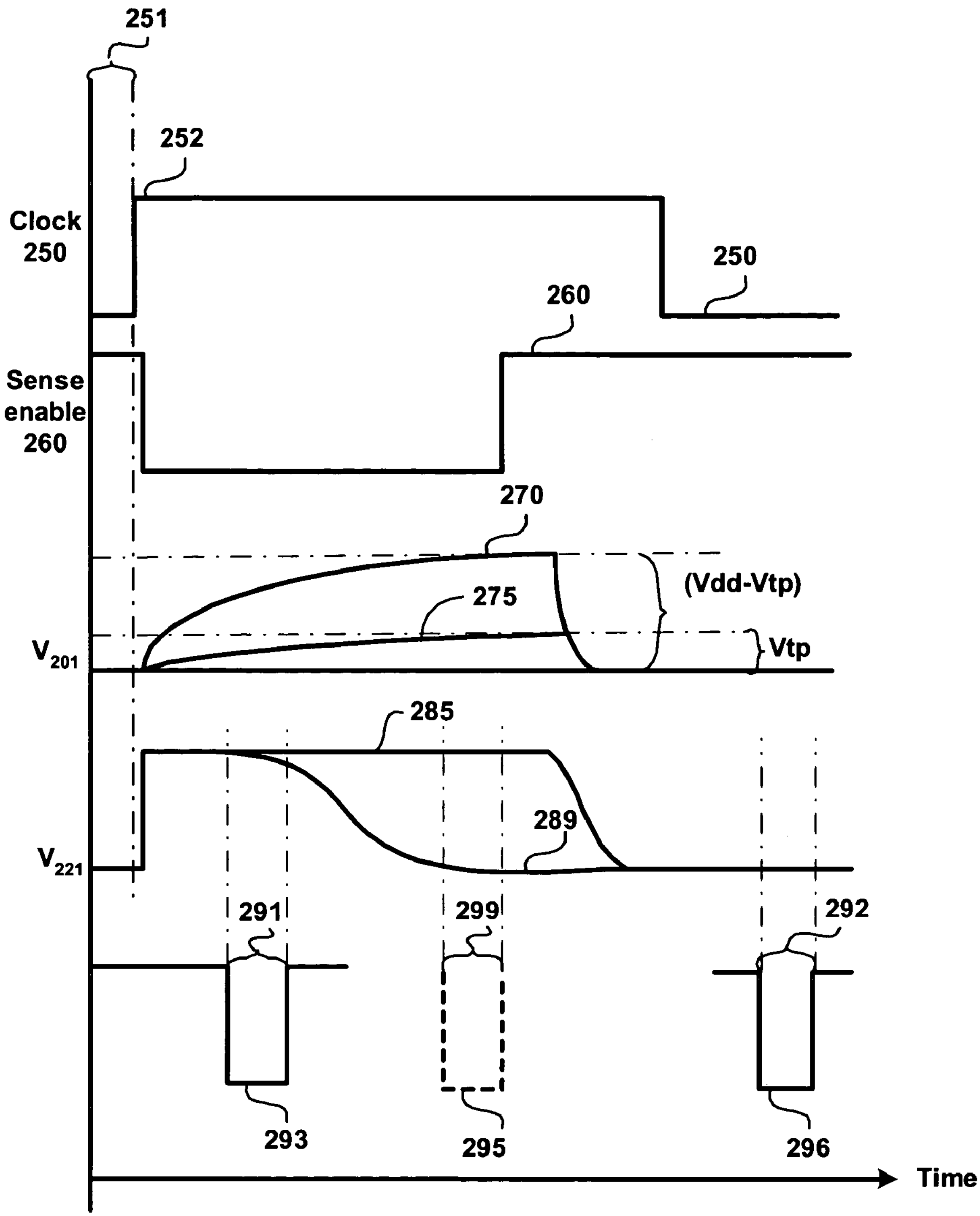
FIG. 2B is a timing diagram illustrating the waveforms at various points of a sense amplifier and the effect of providing latch enable signal at different time points.

The source terminal of PMOS transistor 215 is shown connected to the (node 221) first end of resistive load 225 and input terminal of inverter 230. The second end of resistive load 225 (implemented as a transistor in one embodiment) and source terminal of NMOS transistor 220 is connected to ground terminal. PMOS transistor 215 is implemented as a current mirror of PMOS transistor 210, and thus the current flowing through the two transistors is equal if transistors 210 and 215 are of equal size (W/L). FIG. 2B illustrates the operation of the circuit of FIG. 2A in further detail.

FIG. 2B is a timing diagram illustrating the details of various signals of interest in FIG. 2A. A positive edge of clock signal 250 at time point 252 initiates retrieval of data from memory array 110. It may be noted that pre-charging prior to time point 252 is not needed in the described embodiment, and thus results in power savings. Clock signal 250 causes a change in the state of sense enable 260 (corresponding to path 155 of FIG. 1A) from high to low signal level. The change in the state of sense enable 260 causes switching OFF of NMOS transistor 220 and switching ON of PMOS transistor 205.

V201 represents the voltage at node 201 of FIG. 2A. V201 is shown as two different lines, with waveforms 275 and 270 respectively representing the voltage level changes when the bit line 135 represents 0 and 1. V221 represents the voltage at node 221 and is also shown with two waveforms 285 and 289 respectively representing the voltage level changes when the bit line 135 represents 0 and 1. The status of the two signals V201 and V221 is described in further detail for each case of bit line 135 representing 0 and 1.

When bit line 135 is coupled to a bit cell representing a 0 (i.e., drain terminal connected to the column), the voltage level at node 201 (as shown by waveform 275) may rise only up to less than or equal to Vtp (wherein Vtp represents the threshold voltage) as there is a current path from supply voltage VDD (via transistor 205, which is in the ON state) to ground point (not shown) via memory cell being accessed.

Continuing with reference to description of bit line 135 when coupled to a bit cell representing 0, waveform 285 at node 221 (corresponding to a logic 0 on bit line 135) is shown rising quickly to a high voltage level immediately after time point 252 since transistors 210 and 215 would be turned ON (due to the low voltage level at node 201), and the instantaneous increase in current flown via resistive load 225 increases the voltage at node 221. The high voltage level equals logic 1. The output of inverter 230 would thus equal logic 0 (representing the data on bit line 135).

When bit line 135 is coupled to a bit cell representing 1 (i.e., disconnect as in cell 195-CL), waveform 270 depicts the change of voltage at node 201. The voltage at node 201 is shown rising up to (VDD−Vtp) as there in no direct path to the ground point (due to the absence of connection from the drain terminal to the corresponding column). Waveform 289 at node 221 (corresponding to data of logic 1 stored in memory cell) is shown with the voltage level rising up to (VDD). When the voltage level reaches (VDD−Vtp) at node 201, current flow through PMOS transistor 210 ceases.

The current through transistor 215 also ceases when the current flow through transistor 210 ceases (due to the implementation of the current mirror). When current flow through transistor 215 ceases, the voltage drop across resistive load 225 decreases steeply (as shown in waveform 289) as depicted by portion 289. The voltage level at the output of inverter 230 may change from logic low to logic high (representing the data on bit line 135) only after the voltage level of waveform 289 falls to at least a voltage level which represents logic 0.

From the above, it may be appreciated that actual sense amplifier 150 determines whether a current path is present on path 135, and generates a value of 0 on path 157 if there is a current path and a value of 1 otherwise. The current path is absent (due to the open path provided by the bit cell) when bit cells (representing 1) such as 195-CL are accessed since the drain terminal of the corresponding transistor is not connected to the bit line (via the column). The current path is present when bit cells (representing 0) such as 195-NA are accessed since the drain terminal of the corresponding transistor is connected to the bit line. The value on path 157 thus represents the bit value of the accessed bit cell within actual memory array 110.

The sensing approach of above may provide several advantages. For example, since the bit value is determined merely by sensing the presence of the electric current on the bit line, each memory cell may be implemented using transistors of low drive strength, which in turn leads to high memory density, and low electrical power consumption. The electrical power consumption is further minimized since the approach can be implemented without pre-charging the columns/bit lines.

The complexity of implementation may also be reduced since additional reference signals (e.g., a reference voltage or current) may not need to be generated for comparison to determine the value of the accessed bit. Furthermore, high access rates can be supported since the bit value is determined by sensing current on the bit line. Also, the sense amplifier may be suitable for operation across a wide range (including low) of voltages.

It should be appreciated that the actual sense amplifier is described in the context of FIG. 1A merely for illustration. However, the sense amplifier may be implemented in other environments (e.g., approaches in which dummy sense amplifiers are not required) as well without departing from the scope and spirit of various aspects of the present invention, as will be apparent to one skilled in the relevant arts by reading the disclosure provided herein.

It may be further appreciated that there is only a specific window in which the output on path 157 accurately represents the value of the accessed bit, and latch enable signal 177 may need to be enabled in that window. The timing constraints for enabling the latch enable signal are described below in further detail.

5. Timing Constraints for Latch Enable Signal

It may be appreciated that latch 170 needs to be enabled at a time point at which the output of the inverter 230 generates an output corresponding to the signal represented on bit line 135 (representing data stored in the memory cell being accessed). An appropriate window for sampling is shown by pulse 295 (in duration 299). Thus, latch enable signal 177 may be generated in duration 299 to properly latch the data bit accessed from actual memory array 110. It may be noted that the first/early edge of the pulse 295 determines an appropriate start time for capturing while the width of pulse 295 indicates the duration generally needed to latch the data successfully in latch 170.

If latch enable signal 177 is generated much earlier than duration 299 as represented by pulse 293 (in duration 291), the output voltage of inverter 230 which equals logic 0 is latched even if a value of 1 is accessed from actual memory array 110 as may be appreciated by observing waveform 289. Thus, attempts to access memories at high rates could lead to access errors. If latch enable signal 177 is generated later than duration 299 as represented by pulse 296 (in duration 292), the correct value is latched, but the access rate is decreased (due to the delay in enabling latch 170 even after the accurate data is available).

Accordingly, it may be appreciated that there is a window in which the latch enable signal needs to be enabled for proper latching of data output from the memory array.

However, the first edge of the capturing pulse 295 would be different (shift) for different loads on the bit line in actual memory array 110 on which the signal is received. The first edge would be delayed generally proportionate to the load. The load is lowest when all the bit cells store a value of 1 (drain not connected to the bit line) and highest when all the bit cells store a value of 0. In memory systems with high access rates, the effective window in which sampling would be accurate, would thus be short.

In addition, the first edge of the tracking pulse would be at different time points for different integrated circuits generated for the same masks/design due to process variations. The first edge would change even for a specific implementation due to factors such as change of voltage and temperature. In the case of compiler memories, the window may also change depending on the configuration (i.e., dimension) of the compiler memory since more rows generally implies higher maximum capacitive load.

A tracking circuit according to an aspect of the present invention generates a latch enable signal within an appropriate window irrespective of one or more of such factors, as described below with examples.

6. Tracking Circuit

Figure 3:
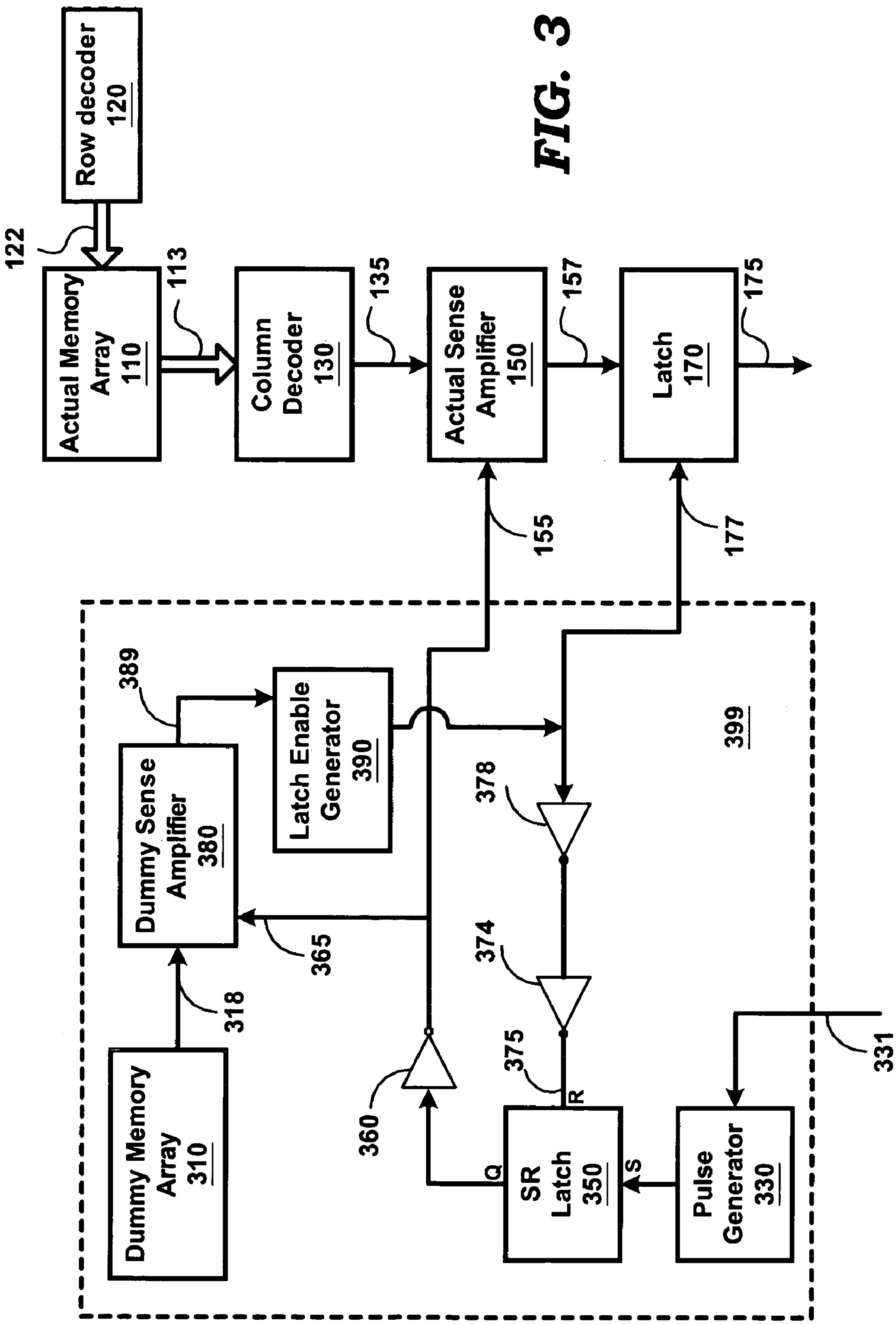
FIG. 3 is a block diagram illustrating the details of a tracking circuit operating with a memory device according to various aspects of the present invention.

FIG. 3 is a block diagram illustrating the operation of a tracking circuit provided according to an aspect of the present invention. Tracking circuit 399 is shown along with the same components of FIG. 1 merely for illustration. Thus, the block diagram is shown containing dummy memory array 310, pulse generator 330, S-R latch 350, inverter 360, dummy sense amplifier 380 and latch enable generator 390, in addition to the components of FIG. 1. Each block as relevant to various aspects of the present invention is described below.

Pulse generator 330 generates a pulse at each rising edge of clock signal 331 (generated by an external clock generator, not shown). The clock signal is generated at a frequency equal to the rate at which data bits may be retrieved from memory array 110. By using various aspects of the present invention, the rate of retrieval may be enhanced while accurately accessing the data in actual memory array 110. Pulse generator 330 may be implemented in a known way.

S-R latch 350 (Q output) goes to a logic high responsive to a pulse generated by pulse generator 330, and remains at that level until reset by a pulse received on path 375. The Q output of S-R latch 350 is provided as input to inverter 360. Inverter 360 generates a complement of the input signal and is provided as sense enable signal to actual sense amplifier 150 (on path 155) and dummy sense amplifier 380 (on path 365). S-R latch 350 and inverter 360 may be implemented in a known way.

Latch enable generator 390 generates a pulse in response to the rising edge of the signal received from dummy sense amplifier 380. The output pulse is provided as latch enable signal on path 177 to latch 170. The output of latch enable generator 390 is also provided as reset (R) input (on path 375) of S-R latch 350 after some delay (provided by inverter 374 and 378). The implementation of latch enable generator 390 will be apparent to one skilled in the relevant arts by reading the disclosure provided herein.

The pulse generated by latch enable generator 390 is within a window similar to window 299. The manner in which dummy memory array 310 and dummy sense amplifier 380 may be implemented to cause latch enable generator 390 to generate the pulse, is described below with reference to FIGS. 4 and 5.

7. Dummy Sense Amplifier and Dummy Memory Element

Figure 4:
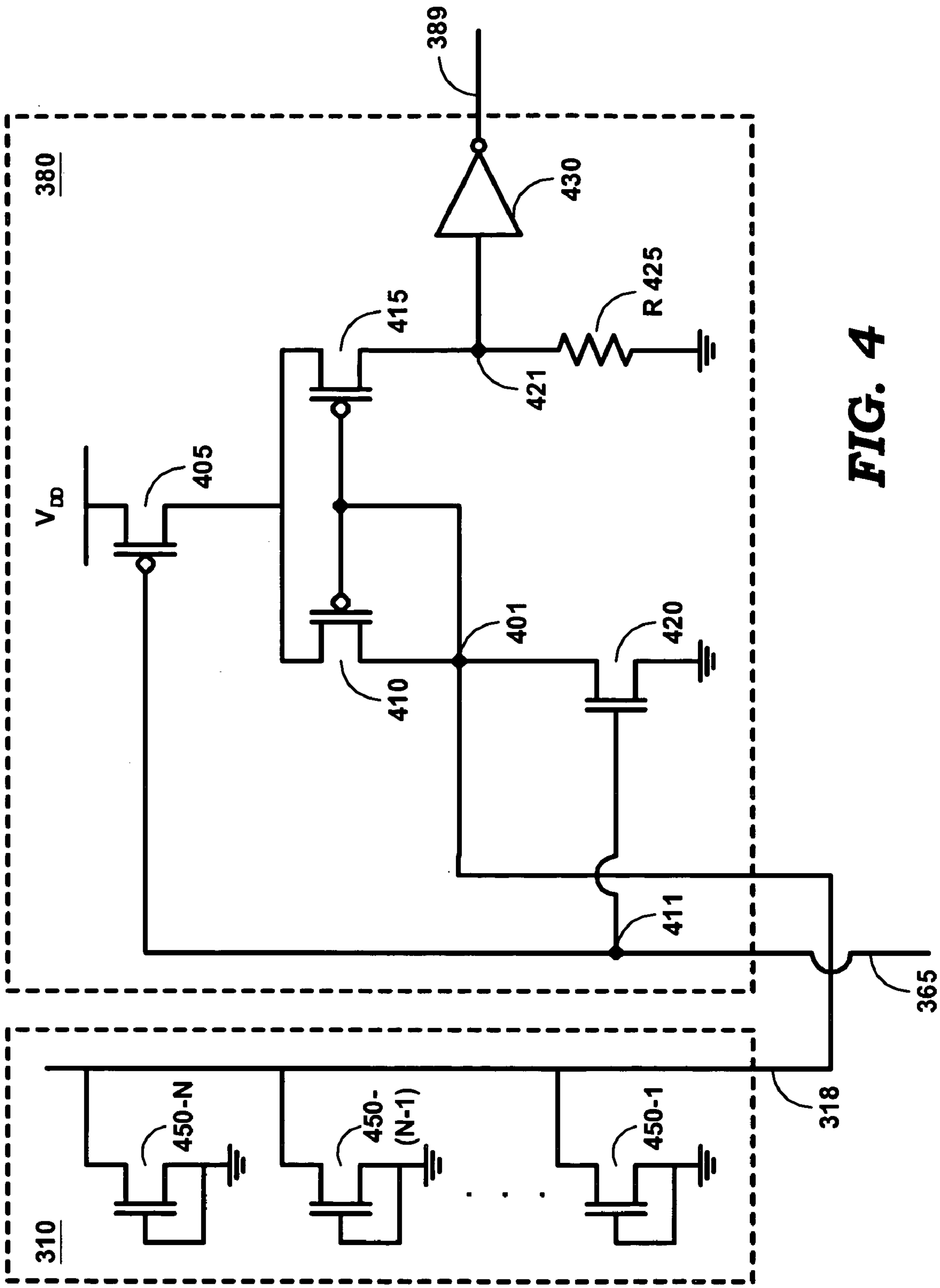
FIG. 4 is a circuit diagram illustrating the details of a tracking circuit implemented according to various aspects of the present invention.

FIG. 4 is circuit diagram illustrating the operation of dummy memory array 310 and dummy sense amplifier 380 in an embodiment of the present invention. For illustration, it is assumed that actual memory array 110 contains N rows×M columns as noted above with reference to FIG. 1B.

Broadly, dummy sense amplifier 380 is implemented to operate in a manner similar to that of actual sense amplifier 150, and dummy memory array 310 is implemented to offer similar load as that would be offer when reading a value of 1 from actual memory array 380. As a result, a transition is generated on signal 389 at a time corresponding to window 299 of FIG. 2 as described below in further detail. Due to such timing, the value read from actual memory array 310 may be latched accurately by latch 170. In an embodiment, actual sense amplifier 150, dummy sense amplifier 380, actual memory array 110, and dummy memory array 310 may be implemented in a same IC (die).

Continuing with reference to FIG. 4, dummy sense amplifier 380 is shown containing PMOS transistors 405, 410 and 415, NMOS transistor 420, resistive load 425, and inverter 430, which respectively operate similar to PMOS transistors 205, 210 and 215, NMOS transistor 220, resistive load 225, and inverter 230 (and the corresponding description is not repeated here in the interest of conciseness). However, dummy bit line 318 is provided as an input to dummy sense amplifier 380, and the generated output 389 is provided as an input to latch enable generator 390.

Dummy memory array 310 generally needs to be designed to offer load such that the latch enable signal is generated in an appropriate time window to cause the bit accessed from actual memory array 110 to be latched. The desired load may be achieved by appropriate design of number of rows and drive strength/size of transistors, as described below with example embodiments.

In one embodiment, dummy memory array 310 is implemented to contain N rows (i.e., the same number as the number of rows in the actual memory array) and 1 column, and may thus be referred to as a dummy column. As shown in FIG. 4, dummy memory array 310 may contain N (the same number as the number of rows in actual memory array) NMOS transistors 450-1 through 450-N. The drain terminal of each transistor is shown connected to dummy bit line 318, and the gate and source terminals are shown connected to ground (making Vgs equal to zero). Each NMOS transistor is implemented similar to the individual transistors in actual memory array 110.

However, the number of elements in the dummy column may be decreased given that other components such as latch enable generator 390 and line capacitance (of various paths) offer additional load. Alternatively, transistors 450-1 through 450-N may be implemented with lower driver strength (compared to transistors of FIG. 1B) to compensate for the additional load introduced by other components. The design of various embodiments of dummy memory 310 will be apparent to one skilled in the relevant arts by reading the disclosure provided herein.

Continuing with the description of FIG. 4, each transistor 450-1 through 450-N is turned off due to the corresponding Vgs equaling 0, and thus does not provide a conducting path from bit line 318 to ground. Each transistor offers a capacitive load on dummy bit line 318 in a corresponding row of actual memory array 110. Assuming each transistor in dummy array 310 is implemented similar to each transistor in actual memory array, the total capacitive load on dummy bit line 318 substantially equals a worst case load offered by the bit line from which actual sense amplifier 150 generates a bit. As noted above with respect to FIG. 2B, the worst case load when all the bit cells of a column represent 0 (i.e., when the drain terminal is connected to the bit line).

Thus, the timing of a transition from 0 to 1 at the output of inverter 430 reflects delay corresponding to a worst case delay that may be expected while reading a bit from a bit line of the actual memory array. Accordingly, a transition from 0 to 1 on the output of inverter 430 is used to trigger the latch enable pulse as described below in further detail with reference to FIG. 5.

Figure 5:
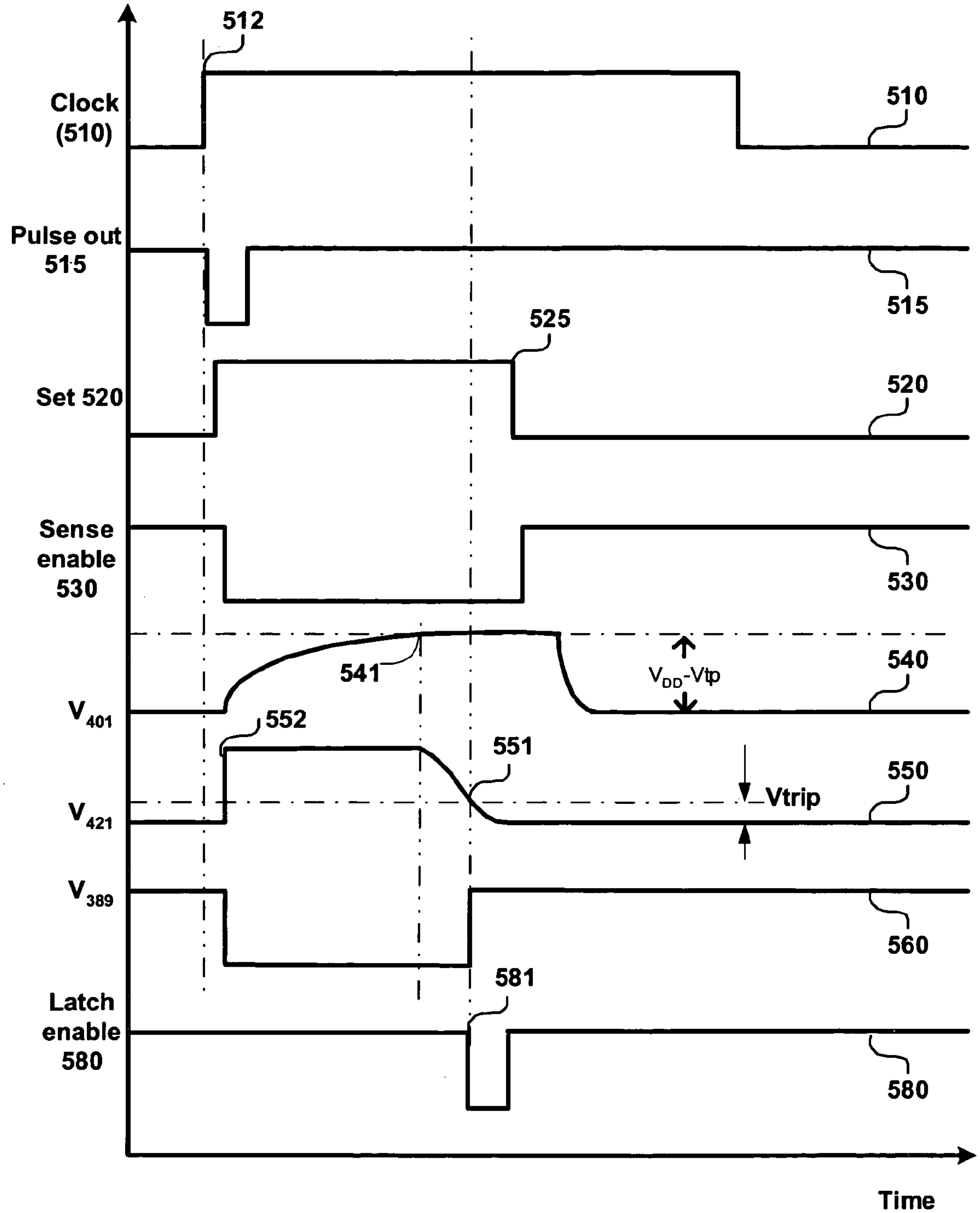
FIG. 5 is a timing diagram illustrating the details of the operation of tracking circuit in an embodiment of the present invention.

FIG. 5 is a timing diagram containing various signals (generated within tracking circuit 399) illustrating the generation of a latch enable signal in an appropriate window according to an aspect of the present invention. The timing diagram is shown containing clock signal 510 (generated by clock generator 320), pulse out 515 (generated by pulse generator 330), set output 520 (generated by S/R latch 350), sense enable 530 (generated by inverter 360), V401 540 (voltage at node 401), V421 550 (voltage at node 421), V389 560 (voltage at node 389), and latch enable 580 (generated by latch enable generator 390).

A positive edge of clock signal 510 at time point 512 initiates retrieval of data from actual memory array 110. A pulse is shown generated on pulse out 515 in response to the positive edge. Set output 520 is shown going to a high logic level in response to the pulse, and stays at that high level until reset at time point 525. S/R latch 350 is reset by a pulse on latch enable 580 delayed (from time point 581 to time point 525) by inverters 378 and 374.

Sense enable 530 is generated as an inverted signal of set output 520. A change in the state of sense enable 530 (generated by inverter 360 on path 365) from high to low level causes switching OFF of NMOS transistor 420 and switching ON of PMOS transistor 405. In addition, bit lines 318 and 135 are discharged before point 512 using transistors 420 and 220 respectively (when sense enable is high). This is done to make sure that the dummy bit line 318 and actual bit line 135 start at the same condition at every clock cycle 512.

V401 540 is shown rising quickly starting from time point 512 as current conducts from Vdd through transistors 405 (turned ON soon after time point 512) and 410. The voltage level at node 401 may rise up to (VDD−Vtp), wherein Vtp represents the threshold voltage of transistor 410. The current flow through transistors 405 and 410 ceases at time point 541 when voltage level at node 401 reaches (VDD−Vtp). Current flow ceases when the potential difference between VDD and node 401 is less or equal to Vtp (wherein Vtp represents the threshold voltage of transistor 410)

V421 550 is shown rising immediately to voltage level close to (VDD) soon after time point 512. Same amount of current flowing through transistor 410 also flows through transistor 415 (due to current mirror). The current flow through load resistor R425 causes a voltage drop across R425 which results in immediate rise of voltage level at node 421 as shown at time point 552.

The voltage level at node 421 remains close to (VDD) till time point 541. As the current flow through transistor 415 ceases (due to current mirror) at time point 541, the voltage level (across resistive load R425) at node 421 starts falling. The voltage level at node 421 falls below threshold Vtrip of inverter 430 at time point 551.

V389 560 is shown going from logic 1 to logic 0 at time point 552 due to the operation of inverter 430 in response to the rise in voltage level on V421 550. V389 560 is shown going from logic 0 to 1 at time point 551 as soon as the voltage at V421 550 falls below Vtrip (the input voltage level at which inverter switches from one output value to the other).

Latch enable 580 is generated (by latch enable generator 390) at time point 581 (on path 177) when the output voltage level of inverter 430 changes (from 0 to 1) at time point 551. In one embodiment, inverter 430 is implemented with a skew to quickly transition from 0 to 1 at time point 551. Such a design of inverter 430 decreases the delay in generation of latch enable 580.

From the above, it may be appreciated that latch enable 580 is generated immediately after dummy sense amplifier 380 generates an output representing 1. Due to the similarity of implementations, actual sense amplifier 150 would also generate an accurate output (representing data bit stored in the accessed cell) by time point 551.

Thus, the pulse on latch enable 580 represents an appropriate window indicated by pulse 295 (in duration 299 of FIG. 2B) in which output of actual sense amplifier 150 (provided on path 157) needs to be latched by latch 170.

Thus, a tracking circuit enables accurate retrieval of data stored in memory array according to several aspects of the present invention. Due to the approaches used, the implementations may be suitable for operation in conjunction with actual memory arrays having a wide range of row and column numbers. A memory unit thus implemented, may be used in several systems. An example system is described below in further detail with reference to FIG. 6.

8. Example System

Figure 6:
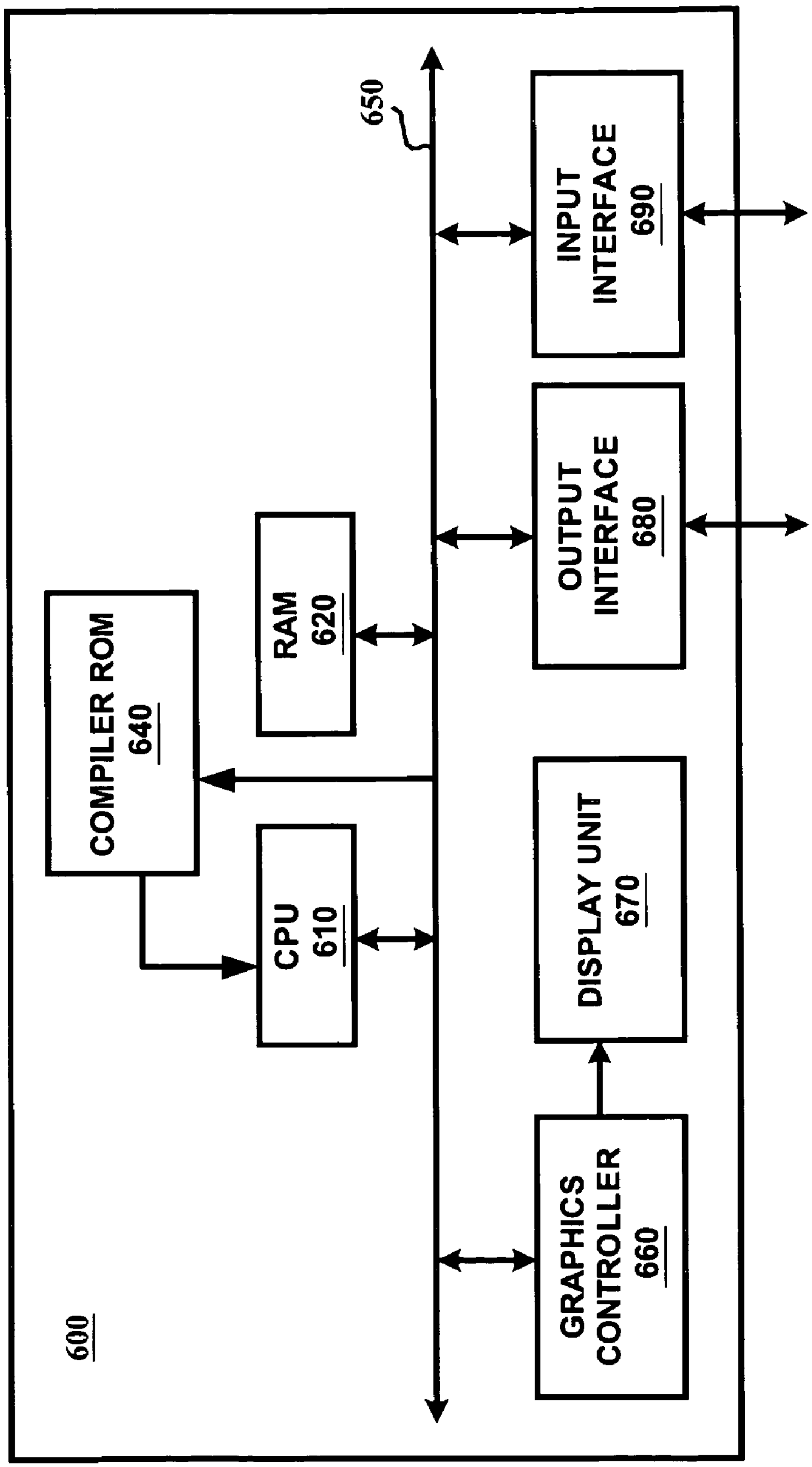
FIG. 6 is a block diagram illustrating the details of an example device in which various aspects of the present invention can be implemented.

FIG. 6 is a block diagram illustrating the details of an example system 600 in which several aspects of the present invention may be implemented. System 600 represents an example digital processing system in which memory system may be implemented according to an aspect of the present invention.

System 600 may contain one or more processors such as central processing unit (CPU) 610, random access memory (RAM) 620, compiler ROM 640, graphics controller 660, display unit 670, network interface 680, and input interface 690. All the components except display unit 670 may communicate with each other over communication path 650, which may contain several buses as is well known in the relevant arts. The components of FIG. 6 are described below in further detail.

CPU 610 may execute instructions stored in compiler ROM 640, for example, during booting-up of system 600. CPU 610 also executes instructions (after boot-up) stored in RAM 620 to perform a specific task. CPU 610 may contain multiple processing units, with each processing unit potentially being designed for a specific task. Alternatively, CPU 610 may contain only a single processing unit. Compiler ROM 640 may be implemented similar to memory system 100 described above.

Graphics controller 660 generates display signals (e.g., in RGB format) to display unit 670 based on data/instructions received from CPU 610. Display unit 670 contains a display screen to display the images defined by the display signals. Input interface 690 may correspond to a key-board and/or mouse, and generally enables a user to provide inputs. Network interface 680 enables some of the inputs (and outputs) to be provided on a network. In general, display unit 670, input interface 690 and network interface 680 enable a user to interface with system 600, and may be implemented in a known way.

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A memory system comprising:

a memory array containing a first plurality of cells, each of first plurality of cells storing a corresponding one of a plurality of data values;

a decoding circuit selectively coupling a first cell to a bit line according to an access address, wherein said first cell is comprised in said plurality of cells;

a sense amplifier determining whether a current path is present on said bit line, said sense amplifier generating a first logical value as an output if said current path is present on said bit line and another logical value as said output otherwise, wherein said output represents a data value stored in said first cell; and wherein said sense amplifier comprises:

a first transistor having a crate terminal connected to a sense enable signal;

a second transistor and a third transistor forming a current mirror, a drain terminal of each of said second transistor and said third transistor being connected to a source terminal of said first transistor, a gate terminal of said second transistor being connected to a crate terminal of said third transistor, said crate terminal of said second transistor also being connected to a source terminal of said second transistor at a first node, said bit line also being connected to said first node:

a fourth transistor having a gate terminal connected to said sense enable signal, a drain terminal of said fourth transistor being connected to said first node;

a resistor being connected to a source terminal of said third transistor at a second node; and an inverter having an input coupled to said second node, wherein an output of said inverter represents said output of said sense amplifier.

2. The memory system of claim 1, wherein said first cell is designed to provide an open path to said bit line it said another logical value is stored and a closed path to said bit line if said first logical value is stored.

3. The memory system of claim 1, wherein each of said first transistor, said second transistor, and said third transistor comprises a PMOS transistor, and said fourth transistor comprises a NMOS transistor, a drain terminal of said first transistor being connected to a supply voltage, a source terminal of said fourth transistor being connected to said ground, and a second end of said resistor also being connected to said ground.

4. The memory system of claim 3 wherein each of said plurality of cells comprises a transistor, said transistor being programmed to store one logic level if said bit line is connected to a drain terminal of said transistor and another logic level otherwise.

5. The memory system of claim 4, wherein said memory array comprises a compiler memory.

6. The memory system of claim 5, wherein each of said plurality of data values comprises a bit.

7. The memory system of claim 1, wherein said memory array is provided in the form of a plurality of rows and a plurality of columns, said decoding circuit comprising:

a row decoder to select one of said plurality of rows; and a column decoder to select one of said plurality of columns.

8. The memory system of claim 1, wherein said memory array comprises an actual memory array.

9. The memory system of claim 1, further comprising a latch coupled to said output of said sense amplifier.

10. The memory system of claim 1, wherein said sense amplifier is implemented without using a reference signal which may be used for comparison with said current to determine the value of said one of said plurality of data values to be provided on said bit line.

* * * * *